United States Patent
Onoe et al.

(10) Patent No.: US 7,705,524 B2
(45) Date of Patent: Apr. 27, 2010

(54) SC CUT CRYSTAL RESONATOR

(75) Inventors: Morio Onoe, Tokyo (JP); Hitoshi Sekimoto, Kanagawa (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 464 days.

(21) Appl. No.: 10/563,431

(22) PCT Filed: Jul. 16, 2004

(86) PCT No.: PCT/JP2004/010557
§ 371 (c)(1),
(2), (4) Date: Feb. 29, 2008

(87) PCT Pub. No.: WO2005/008887
PCT Pub. Date: Jan. 27, 2005

(65) Prior Publication Data
US 2008/0203858 A1 Aug. 28, 2008

(30) Foreign Application Priority Data
Jul. 18, 2003 (JP) .............................. 2003-276408

(51) Int. Cl.
*H01L 41/16* (2006.01)
(52) U.S. Cl. ...................................................... 310/361
(58) Field of Classification Search .................. 310/361
See application file for complete search history.

(56) References Cited

U.S. PATENT DOCUMENTS 4,701,661 A 10/1987 Warner et al.

FOREIGN PATENT DOCUMENTS

| JP | 56-35524 | * | 4/1981 |
| JP | 59 158612 A | | 9/1984 |
| JP | 59 193612 A | | 11/1984 |
| JP | 4-123605 A | | 4/1992 |
| JP | 05 243890 A | | 9/1993 |
| JP | 5-243890 A | | 9/1993 |
| JP | 11-177376 | | 7/1999 |
| JP | 20040238221 | * | 8/2004 |

OTHER PUBLICATIONS

Examination Report issued Nov. 26, 2008 of corresponding European Patent Application No. 04747920.9.

(Continued)

*Primary Examiner*—Thomas M Dougherty
(74) *Attorney, Agent, or Firm*—Scott D. Wofsy; Edwards Angell Palmer & Dodge LLP

(57) ABSTRACT

The outer shape of a quartz crystal blank is processed to have a predetermined shape, thereby providing an SC cut crystal resonator capable of reliably and reproducibly suppressing B mode resonance. In this SC cut crystal resonator, the surface of the quartz crystal orthogonal to the Y axis is rotated through 33° to 35° about the X axis and is then rotated from this rotated position through 22° to 24° about the Z axis, and a slender quartz crystal blank oblong in an X' axis direction is cut from the rotated surface. The end surface of the quartz crystal blank orthogonal to the Z' axis is tilted in a direction rotated through +7° to +13° or −7° to −13° about the X' axis.

2 Claims, 2 Drawing Sheets

OTHER PUBLICATIONS

International Search Report dated Aug. 31, 2004.
Office Action dated Mar. 21, 2008 regarding the cooresponding Chinese Patent Application No. 200480020561.2 issued by the State Intellectual Property Office of P.R. China w/translation.
Office Action dated Jul. 11, 2008 regarding the corresponding Chinese Patent Application No. 200480020561.2 issued by the State Intellectual Property Office of P.R. China w/translation.
European Search Report dated Aug. 27, 2008.
Koyama, M., et al: "Suppression of the Unwanted Response of an SC-Cut Crystal Unit," Forty-fifth Annual Symposium on Frequency Control, 1991 IEEE.
Ionov, B.P., "A Stable Oscillator Circuit for Generators with Direct Temperature Controlled Crystal Unit," 1999 Joint Meeting EFTF—IEEE IFCS.

* cited by examiner

SC CUT CRYSTAL RESONATOR

TECHNICAL FIELD

The present invention relates to an SC cut crystal resonator, particularly to an SC cut crystal resonator having a shape whereby excellent vibration characteristics can be obtained.

BACKGROUND ART

Conventionally, as a doubly rotated crystal resonator, an SC cut crystal resonator is known as shown for example in FIG. 3, in which electrodes are formed on a quartz crystal blank 1 cut from a surface of a quartz crystal where the surface of the quartz crystal orthogonal to a Y axis is rotated through approximately 33° about the X axis and then from this rotated position it is rotated through approximately 22° about the Z axis (for example, refer to Japanese Unexamined Patent Publication (TOKKYO KOKAI) No. Hei 11-177376).

This SC cut crystal resonator has temperature characteristics expressed in a cubic curve similar to that of an AT cut, and its inflection point is in the vicinity of 94° C. It is used as a crystal resonator of a so-called oven controlled crystal oscillator, in which a crystal resonator is temperature controlled.

However, as shown in FIG. 4, in the SC cut crystal resonator, secondary vibration of B mode (denoted by B in FIG. 4) and A mode (denoted by A) vibration occurs in the vicinity of a C mode resonance (vibration) (denoted by C), which is a main vibration, and is on the high pass side thereof.

Here, since the value of an equivalent resistance (hereunder referred to as "CI" (Crystal Impedance)) of the A mode vibration is greater than a CI of the C mode, then as an oscillator, the signal cannot be easily output. Therefore particularly in a crystal resonator this does not become a problem.

On the other hand, the CI of the B mode vibration is equal to the CI of the C mode vibration or may be smaller in some cases. Furthermore, their frequencies are close to each other, with that of the B mode being approximately 1.09 times that of C mode.

Therefore when the oscillator is actually manufactured, occasionally this oscillates in the B mode, which is a secondary vibration.

Thus, in the case of using an SC cut crystal resonator, it is essential to be able to suppress the B mode vibration in order to reliably excite the C mode vibration, so that it is necessary to make the CI of the B mode larger than the CI of the C mode. Therefore suppression of the B mode vibration is performed by adding mass to the plate surface of the quartz crystal blank, or by designing the holding position thereof, to suppress the spurious oscillation.

However, in order to sufficiently suppress the B mode vibration, a continuing process of trial and error is necessary, which and takes a lot of work, and reproducibility of the process is extremely poor.

The SC cut crystal resonator of the present invention has been achieved in consideration of the problems of such a conventional SC cut crystal resonator, with an object of providing an SC cut crystal resonator wherein, by cut-processing an outer shape of a quartz crystal blank into a special shape, resonance (vibration) due to the B mode can be reliably suppressed with excellent reproducibility.

DISCLOSURE OF THE INVENTION

An SC cut crystal resonator of the present invention is characterized in that an end surface orthogonal to a Z' axis of a slender quartz crystal blank oblong in an X' axis direction which is formed by being cut from a surface of a quartz crystal which has been rotated through 33° to 35° about an X axis from a surface orthogonal to a Y axis, and is then rotated from this rotated position through 22° to 24° about a Z axis, is tilted in a direction rotated through +7° to +13°, or −7° to −13° about the X' axis. Furthermore, the SC cut crystal resonator, is characterized in that the tilt angle is between −9° and −11° or between +9° and +11°.

In the SC cut crystal resonator of the present invention, the surface of the longitudinal direction end of the slender SC cut quartz crystal blank is processed so as to be tilted. Therefore the present invention can suppress B mode vibration, and a change in the inflection point temperature does not occur even when the shape is miniaturized.

Accordingly, an oscillator can be designed and manufactured easily, thus a low cost SC cut crystal resonator, whereby excellent oscillation characteristics being obtained, can be provided.

BEST MODE FOR CARRYING OUT THE INVENTION

Hereunder, an embodiment of an SC cut crystal resonator of the present invention is described, with reference to the appended drawings.

Figure 1:
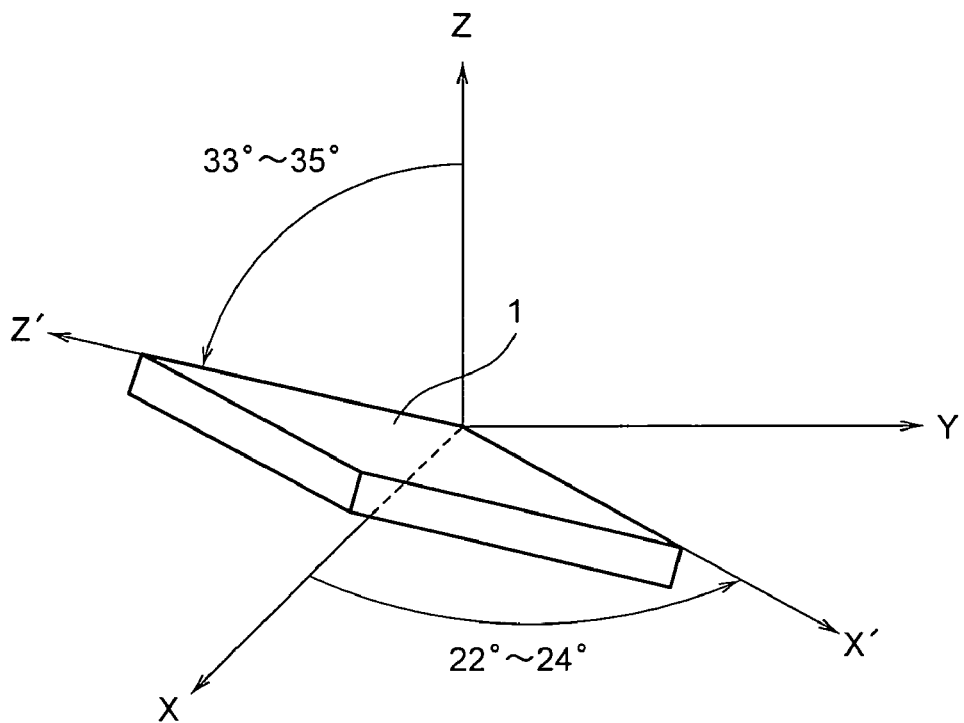
FIG. 1 is a perspective view showing a cut angle of an SC cut crystal plate of the present invention.

FIG. 1 is a perspective view showing a cut angle of a quartz crystal blank 1 used for the SC cut crystal resonator of the present invention.

That is to say, here a surface orthogonal to a Y axis of the quartz crystal is rotated through 33° to 35° about the X axis, and is then rotated from this rotated position through 22° to 24° about the Z axis.

As a result of carrying out such a double rotation, an X-Z surface orthogonal to the Y axis in FIG. 1 becomes a Z'-X' surface. In the case where in the above manner, the surface is rotated through 33° to 35° about the X axis and is then rotated from this rotated position through 22° to 24° about the Z axis, it can be excited as a so-called SC cut crystal resonator.

Figure 2:
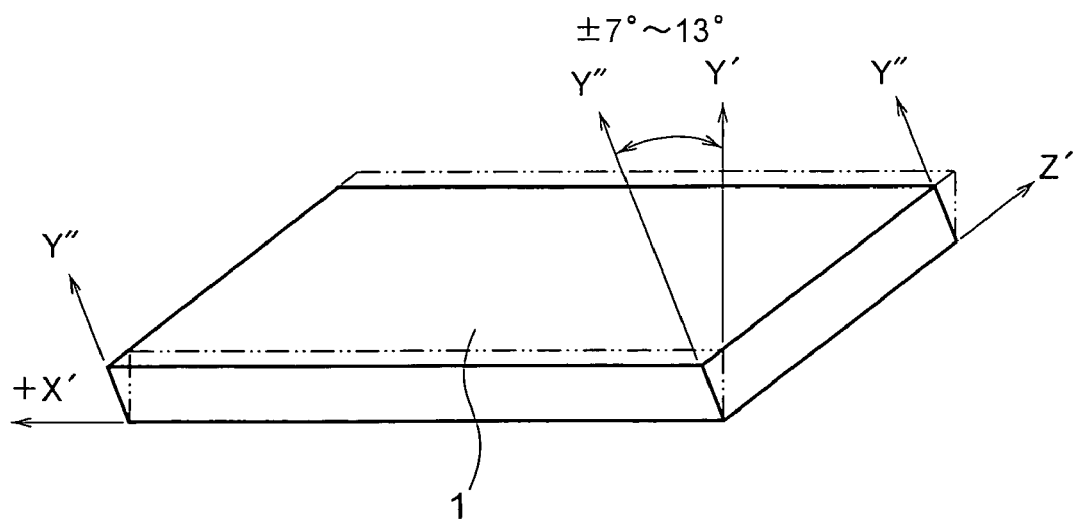
FIG. 2 is a perspective view showing a quartz crystal blank which has been cut from the crystal plate shown in FIG. 1.
Figure 3:
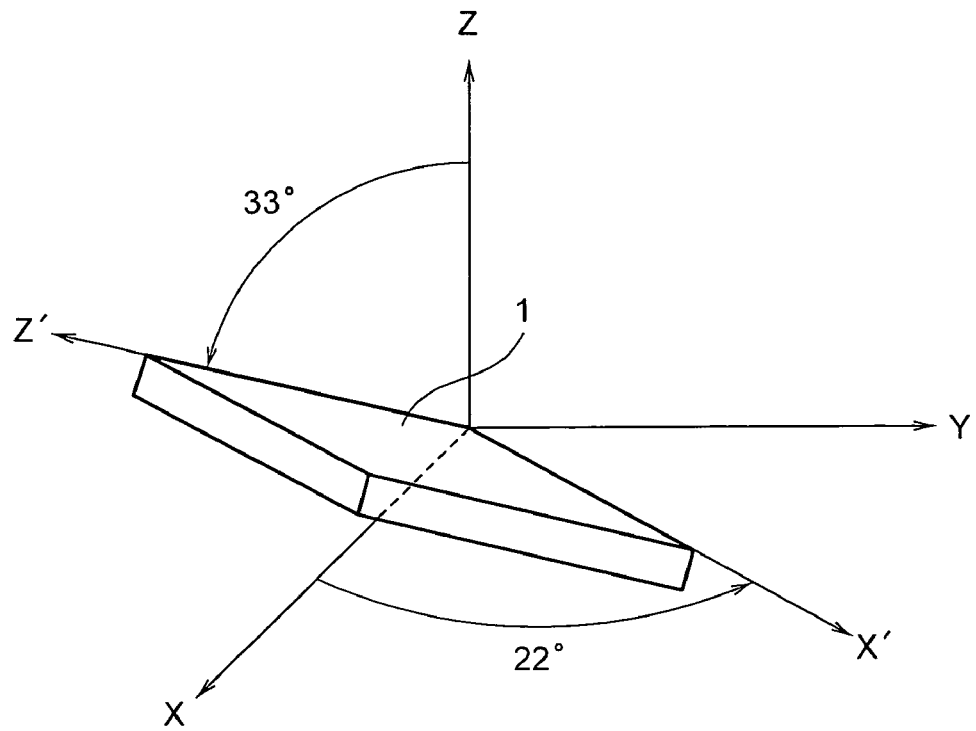
FIG. 3 is a perspective view showing the cut angle of a conventional SC cut crystal plate.
Figure 4:
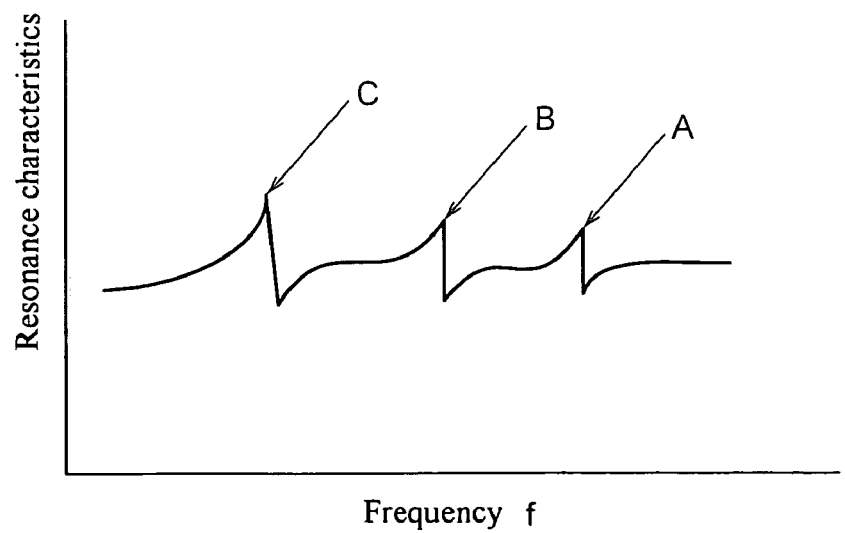
FIG. 4 is a graph showing resonance characteristics of a conventional SC cut crystal plate.

Moreover, the axially slender oblong quartz crystal blank 1 is cut out along the X' axis from the Z'-X' surface crystal plate as shown in FIG. 2. Then, a surface of the longitudinal end of the quartz crystal blank 1, that is, an end surface (X'-Y' surface) orthogonal to the Z' axis is subjected to a tilting process.

The tilt angle for this end surface is through +7° to +13° or through −7° to −13° about the X' axis, and the end surface of the quartz crystal blank tilted in this way becomes a surface X'-Y''.

At an end surface tilt angle between +7° and +13°, or −7° and −13°, an excellent mode B suppressing effect is obtained. More preferably, this tilt angle is between ±9° and ±11°.

When manufacturing a crystal resonator from such a quartz crystal blank, a pair of excitation electrodes is formed facing each other on the plate surfaces of the quartz crystal blank. Moreover, the crystal resonator is constructed by accommodating the quartz crystal blank in a predetermined container, and holding by an appropriate holding device, and externally leading out the excitation electrodes.

By cut-processing the outer shape of the quartz crystal blank in this way, face shear vibration mode can be suppressed. In particular, the B mode vibration, which is deleterious secondary vibration, is vibration of a face shear vibration mode type. However, with the SC cut crystal resonator of the present invention, the B mode vibration can be suppressed, and the mode C vibration which is the main vibration can be reliably excited.

That is to say, in the oblong SC cut quartz crystal blank slender in the X' axis direction, when the end surface orthogonal to the Z' axis is tilted through −10°, the CI in the B mode increases by approximately 50% compared to that of a quartz crystal blank whose end surface is not tilted. On the other hand, the B mode vibration is significantly suppressed.

Therefore, the deleterious B mode vibration, which has conventionally been the greatest drawback when an SC cut crystal resonator is used, can be reliably suppressed, and a useful oscillator can be obtained without using special processing, or a special oscillating circuit.

Furthermore, the inflection point temperature 94° of the SC cut crystal resonator exhibits a phenomenon of shifting to the higher temperature side in the case where the quartz crystal blank is miniaturized. Therefore when assembling an oscillator, the setting of a set temperature for a thermostatic oven is difficult. However, when using the quartz crystal blank of the present invention shown in FIG. 2, in which the end surface thereof is tilted, then even if the shape of the quartz crystal blank is miniaturized, the inflection point temperature of the crystal resonator is maintained at 94°, and does not shift to the high temperature side.

INDUSTRIAL APPLICABILITY

As described above, the SC cut crystal resonator of the present invention is useful as a crystal resonator of an oven controlled crystal oscillator, and especially, it is suitable for use in a crystal oscillator that can suppress the B mode vibrations, and that can reliably excite C mode vibrations.

The invention claimed is:

1. An SC cut crystal resonator, wherein a surface of a quartz crystal orthogonal to a Y axis thereof is rotated through 33° to 35° about an X axis, and is then rotated from this rotated position through 22° to 24° about a Z axis, and a slender quartz crystal blank oblong in an X' axis direction is cut from the rotated surface, and an end surface of said quartz crystal blank orthogonal to a Z' axis, has a tilt angle tilted in a direction rotated through a predetermined angle about the X' axis, wherein said tilt angle is between −7° and −13°.

2. An SC cut crystal resonator, wherein a surface of a quartz crystal orthogonal to a Y axis thereof is rotated through 33° to 35° about an X axis, and is then rotated from this rotated position through 22° to 24° about a Z axis, and a slender quartz crystal blank oblong in an X' axis direction is cut from the rotated surface, and an end surface of said quartz crystal blank orthogonal to a Z' axis, has a tilt angle tilted in a direction rotated through a predetermined angle about the X' axis, wherein said tilt angle is between +7° and +13°.

* * * * *